United States Patent
Cole

(10) Patent No.: US 7,499,276 B2
(45) Date of Patent: Mar. 3, 2009

(54) GAMING DEVICE COOLING SYSTEM

(75) Inventor: Joseph W. Cole, North Las Vegas, NV (US)

(73) Assignee: Cole Industries, Inc., North Las Vegas, NV (US)

( * ) Notice: Subject to any disclaimer, the term of this patent is extended or adjusted under 35 U.S.C. 154(b) by 0 days.

(21) Appl. No.: 11/821,310

(22) Filed: Jun. 22, 2007

(65) Prior Publication Data
US 2008/0316701 A1    Dec. 25, 2008

(51) Int. Cl.
*H05K 7/20* (2006.01)
*H05K 5/00* (2006.01)
*A63F 13/08* (2006.01)

(52) U.S. Cl. .............. 361/695; 361/690; 361/694; 463/46; 454/184

(58) Field of Classification Search .............. None
See application file for complete search history.

(56) References Cited

U.S. PATENT DOCUMENTS

| | | | |
|---|---|---|---|
| 5,417,433 A | 5/1995 | Phillips | |
| 5,775,987 A | 7/1998 | Brinket | |
| 6,152,451 A | 11/2000 | Bixby | |
| D439,931 S | 4/2001 | Yamaguchi | |
| 6,280,318 B1 | 8/2001 | Criss-Puszkiewicz et al. | |
| 6,439,992 B1 | 8/2002 | Demeter | |
| 6,491,298 B1 | 12/2002 | Criss-Puszkiewicz et al. | |
| 6,525,936 B2 * | 2/2003 | Beitelmal et al. ........ | 361/695 |
| 6,688,984 B2 * | 2/2004 | Cole ........................ | 463/46 |
| 6,702,667 B2 | 3/2004 | Mattice et al. | |
| 7,036,027 B2 | 4/2006 | Kim et al. | |
| 7,241,222 B2 | 7/2007 | Cole | |
| 2003/0124971 A1 * | 7/2003 | Williams ................. | 454/184 |
| 2004/0235570 A1 * | 11/2004 | Rothschild et al. ....... | 463/46 |
| 2006/0249896 A1 | 11/2006 | Yamazaki et al. | |
| 2006/0287111 A1 | 12/2006 | Mitchell et al. | |
| 2007/0060034 A1 | 3/2007 | Tanner | |
| 2007/0199287 A1 * | 8/2007 | Wiser ...................... | 55/385.1 |
| 2008/0108439 A1 * | 5/2008 | Cole ........................ | 463/46 |

OTHER PUBLICATIONS

"Players Choice Drop-In Bar/ Slant Top", International Game Technology, published by IGT circa Oct. 1995, 2 pages.
"IGT:S-Plus Sant Top", International Game Technology, published by IGT circa Oct. 1995, 2 pages.

* cited by examiner

*Primary Examiner*—Gregory D Thompson
(74) *Attorney, Agent, or Firm*—Weide & Miller, Ltd.

(57) ABSTRACT

A gaming device has a housing with at least one air inlet vent and at least one air exhaust vent. In one aspect of the invention, the vents are configured with a duct or flange having at least one upwardly sloping portion configured to prevent the entry of contaminants such as liquids into the gaming device. In another aspect of the invention, a gaming machine cooling system includes at least one air flow device such as a centrifugal blower or squirrel-cage air handling device which provides high volumetric air flow at positive pressure. The air flow device is coupled to the exhaust vent, whereby the air flow device exhausts air from the interior to the exterior of the gaming device. A low pressure condition in the gaming machine causes cool air to be drawn into the interior of the housing.

15 Claims, 3 Drawing Sheets

GAMING DEVICE COOLING SYSTEM

FIELD OF THE INVENTION

The present invention relates to gaming devices and particularly to an improved configuration for cooling components of a gaming device.

BACKGROUND OF THE INVENTION

The gaming industry has experienced tremendous growth and increased popularity in recent times. As a result, gaming devices such as slot machines, video poker machines, and many of the new computerized multi-game devices have become extremely popular and are commonly the primary attraction for many gaming and entertainment establishments. These gaming devices are the subject of immense design efforts by game manufacturers which strive to develop new gaming devices that will attract players, encourage game play and maximize establishment profits.

In order to capture the public's interest and entice interaction with gaming devices, game manufacturers continually improve their gaming devices by incorporating newly developed technologies. The incorporation of these new technologies enables the gaming device to provide an advanced gaming environment utilizing such improvements as enhanced graphics, multi-media content, interactive game play and more exciting games. For example, some of the more advanced gaming devices may employ more than one visual display for presenting multi-media content such as animations and video clips.

As these newer technologies have been utilized, the traditional mechanical-type slot machines are frequently being replaced with new high-tech electronic gaming devices. These electronic gaming devices commonly utilize numerous internal electrical components such as a power supply, a visual display, a communication board, a sound system, a computer or controller, a printer, a currency acceptor and various card readers to name a few. One issue related to the implementation of these components is that they generate heat. If the components are not cooled adequately, the components may malfunction or prematurely fail. This issue of heat generation is even more pronounced relative to gaming machines because such devices are commonly always left "on" to attract players and take full advantage of the profit earning potential of the gaming device.

In addition to incorporating new technologies into existing gaming devices, game manufactures strive to design smaller and more compact gaming devices. In today's gaming establishments, casino floor space is at a premium and is extremely expensive to develop. As a result, gaming establishments are motivated to optimize the casino floor space and thus maximize casino profitability by providing as many gaming devices as can physically be placed on the casino floor. Correspondingly, gaming devices that are smaller and more compact are favored by the gaming establishments. However, as the machines become smaller, the components therein are located closer together and it thus becomes increasingly difficult to cool those components.

The current techniques employed for thermal management have several disadvantages. For example, while natural convection of air through the gaming device may be utilized, this air flow often proves inadequate to offset the rate of heat generation.

Correspondingly, an improved gaming device cooling system is desired that provides adequate thermal management, reduces the probability of component failure and maximizes gaming device run-time and thus casino profitability.

SUMMARY OF THE INVENTION

One aspect of the invention is an air flow vent configuration that prevents contaminants from entering an interior area of the gaming device. Another aspect of the invention is a cooling configuration in which one or more air flow devices, preferably in the form of blowers, are utilized to move cooling air through a gaming machine.

In one embodiment of a vent configuration, a gaming machine comprises a housing defining an interior area, the housing having at least one inlet vent and at least one exhaust vent. The vents permits air to flow to and from the said interior area to an exterior of the housing. The at least one inlet vent has a duct extending into the interior area of said housing. The duct has at least one portion which slopes upwardly, whereby the duct is configured to prevent the flow of water or other material into the interior area. The cooling system further includes at least one exhaust vent having a duct extending into the interior area of the housing, where the duct has at least one portion which slopes upwardly, whereby the duct is configured to prevent the flow of water or other material into the interior area.

In a preferred embodiment, the one or more exhaust vents are located above the one or more inlet vents. The inlet and exhaust vents may be located at first and second opposing sides of the housing, in a back or other portion of the gaming machine housing. The at least one exhaust vent may have a substantially larger area than the at least one inlet vent. The at least one inlet vent may be coupled with a particle filter to prevent entry of various contaminants into the gaming device.

In accordance with one embodiment of the invention, a gaming machine includes a cooling system. The gaming machine comprises a housing having one or more inlet vents through which air may enter the housing, and at least one exhaust vent through which air may be expelled from the interior area to a location exterior to the housing. The at least one exhaust vent is preferably located above the one or more inlet vents. The cooling system further comprises at least one air moving device having an inlet port located within the interior area of the housing, and at least one outlet port in communication with the at least one exhaust vent. The blower is configured to produce a substantial pressure differential between the inlet and the outlet ports. The blower draws air from within the interior area and expels it to through the at least one exhaust vent. This expelling of air causes air to be drawn though the one or more inlet vents into the interior area of the gaming machine. In one embodiment, the air moving device comprises a blower, and more preferably, a centrifugal-type blower.

Further objects, features, and advantages of the present invention over the prior art will become apparent from the detailed description which follows, when considered with the figures provided herein.

DETAILED DESCRIPTION OF THE INVENTION

In the following description, numerous specific details are set forth in order to provide a more thorough description of the present invention. It will be apparent, however, to one skilled in the art, that the present invention may be practiced without these specific details. In other instances, well-known features have not been described in detail so as not to obscure the invention.

In general, the invention is a cooling method and system. The method and system for cooling are configured to facilitate dissipation of heat from an interior of a gaming device, including electrical components located therein. In a preferred embodiment, the cooling system utilizes at least one positive pressure air flow device capable of moving high volumes of air. Another embodiment of the invention is a cooling system including one or more vents configured to prevent the entry of materials into the gaming device.

Figure 1:
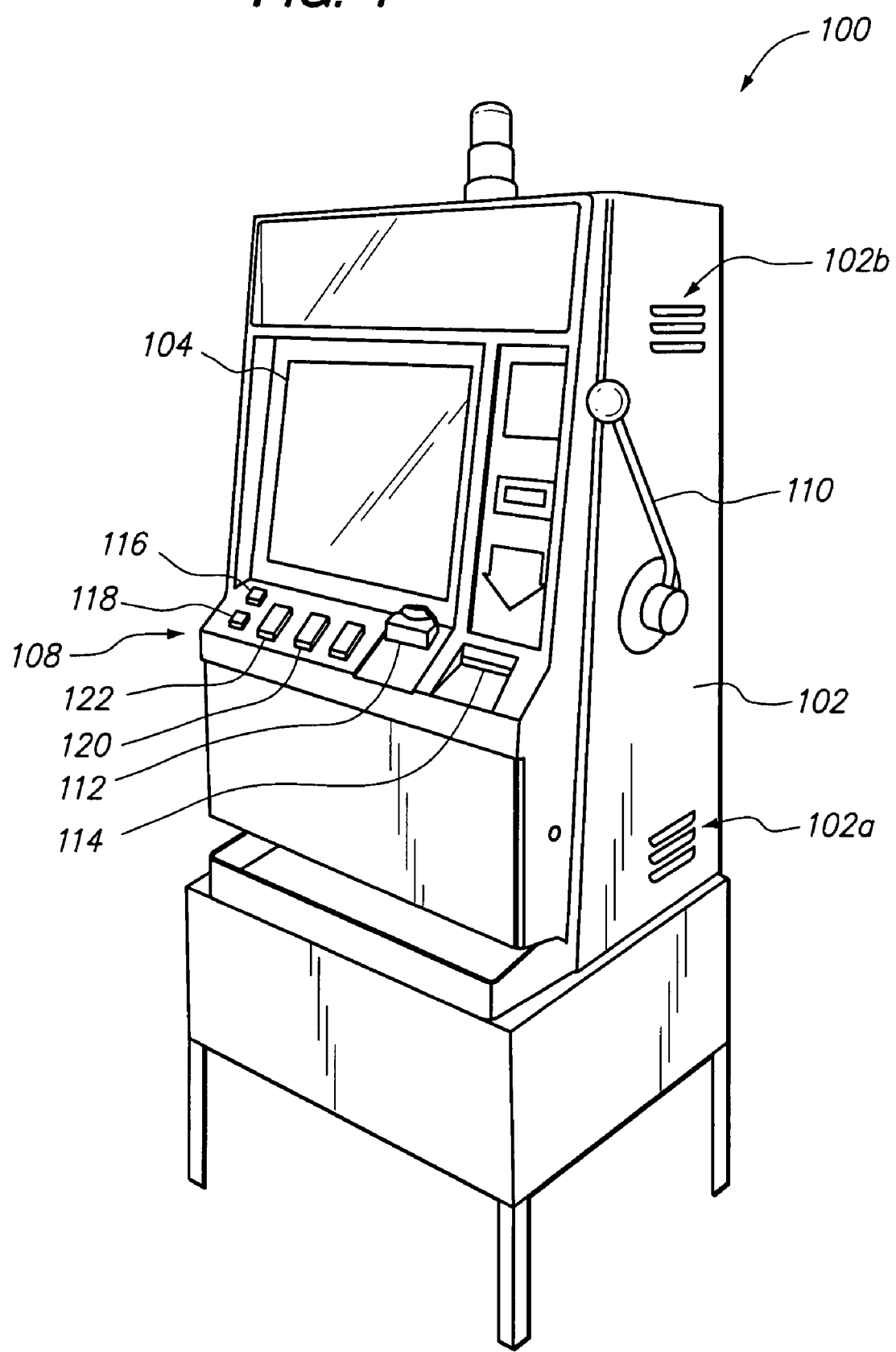
FIG. 1 is an isometric view illustrating a gaming device with inlet and exhaust air vents.

FIG. 1 illustrates one embodiment of a gaming device or gaming machine 100 to which the cooling system and method of the invention may be applied. As illustrated, the gaming device 100 is positioned atop a support stand for convenient access by a player, but it may be mounted in a variety of manners. Preferably, the gaming device 100 is a wager-based gaming device configured to present one or more games to a player which offer the possibility of an award of winnings.

In one embodiment, the gaming device 100 defines a generally enclosed interior space for housing one or more components. As illustrated, the gaming device 100 generally comprises a housing or cabinet 102 for supporting and/or enclosing various components required for operation of the gaming device. In the embodiment illustrated, the housing 102 includes a door located at a front thereof, the door capable of being moved between an open position which allows access to the interior, and a closed position in which access to the interior is generally prevented.

In order to facilitate the entry of air into the interior of the gaming device 100 and to facilitate the exit of air from the interior of the gaming device 100, the gaming device may be configured with one or more air vents, ports or openings. As illustrated, an inlet vent 102a and an exhaust vent 102b are provided through one of the sides of the housing 102. These vents 102a,102b provide a flow path through which surrounding environmental air may pass from the exterior of the housing 102 to the interior thereof, and from the interior of the housing back to the exterior thereof. It is contemplated that the gaming device 100 may include vents in a variety of numbers and locations, as described in greater detail below.

The gaming device 100 preferably includes at least one display device 104 configured to display game information. The display device 104 may be a mechanical, electro-mechanical or electronic display, such as one or more rotating reels, a video display or the like. When the display device 104 is an electronic video display, it may comprise a cathode ray tube (CRT), high resolution flat panel liquid crystal display (LCD), projection LCD, plasma display, field emission display, digital micro-mirror display (DMD), digital light processing display (DLP), LCD touchscreen, a light emitting display (LED) or other suitable displays now known or later developed, in a variety of resolutions, sizes and formats (e.g. 4:3, widescreen or the like). The display 104 may be capable of projecting or displaying a wide variety of information, including images, symbols and other indicia such as images of characters, places, card faces or other elements or information associated with game play, game promotion or other events.

The gaming device 100 may be configured to present a wide variety of games. These may include video poker games, slot-type games, blackjack, bingo and bingo-based games, and other games now known or later developed. In one embodiment, certain game outcomes may be designed as winning outcomes. Awards may be provided for winning outcomes, such as monetary payments (or representations thereof, such as award of credits). As is well known in the art, the number of winning outcomes may vary dependent upon the desired payout or winning percentage offered to the players as compared to wagers that are retained by the gaming establishment.

The gaming device 100 also preferably includes one or more player input devices 108 (such as a spin arm, control buttons, a touch-screen display, joystick, touch-pad or the like) that may be utilized by the player to facilitate game play. In one embodiment the gaming device may be actuated by a mechanical linkage or electro-mechanical device associated with a spin arm 110, with movement of the spin arm (a "pull") by a player causes the gaming device to commence game play.

Also included in the player input devices 108, is a means for accepting a wager or token representing monetary value. Illustrated in FIG. 1, a coin accepting mechanism 112 is provided for accepting coins as well as a currency or bill acceptor 114 is provided for accepting cash or paper currency. It is contemplated that other mechanisms may be provided for accepting a wager, such as credit card, ticket readers or input devices whereby a player may have funds paid from a remote account.

Typically when a player cashes out, the player receives either a paper currency voucher or currency in the form of a coin disbursement. If the player decides to receive a coin disbursement, the gaming device 100 activates a coin hopper or coin handling device (not shown) which physically counts and delivers the proper number of coins to the player. The coin handling device is commonly configured to transport coins from a supply source (hopper or bin filled with coins) to a coin tray or payout receptacle where the player physically receives the coins. The player might also elect to cash out by having a ticket or other media dispensed, such as via a printer 114.

The gaming device 100 may be configured as a stand-alone device or be in communication with one or more external devices at one or more times. For example, the gaming device 100 may be configured as a server based device and obtain game code or game outcome information from a remote server. The gaming device 100 may also communicate with a remote accounting server and/or player tracking server, as is well known in the art.

In operation, the player may initiate game play by placing a wager. The wager is placed by activating one of the player input devices 108 such as a play one credit button 116 which places a single credit wager or a max bet button 118 which places a maximum wager for that round of game play. The maximum bet is commonly defined as playing or betting an amount comprising a multiple of the value of a single wager up to a predefined upper bet limit or threshold. When the player actuates either the play one credit button 116 or the max bet button 118, a wager in that amount is placed and the player's credit base is decreased by the number of credits wagered. The player's remaining credit base is typically displayed to the player by way of the display device 104. Upon placing a wager, the game may begin automatically or the player may initiate the game by activating another player input device such as spin button 120 or by pulling or actuating a spin arm 110. After activating the spin button/arm 120,110 the gaming device 100 presents one or more game elements which are used to determine if the player has received a winning combination. The determination is preferably performed by a game controller which is discussed in greater detail below.

The gaming device 100 generally includes a means for paying a player any winnings accumulated during game play. When a player wins a game, the player is preferably paid in the form of stored credits, the amount of which is indicated to the player on the display 104. A "cash out" button 122 is preferably provided for permitting a player to be paid the winnings or redeeming any credits initially paid into the gaming device 100. The term "cash out" is used herein to define an event initiated by the player wherein the player receives a number of coins or currency that is equivalent to the value of the player's accrued credit base.

Typically when a player cashes out, the player receives either a paper currency voucher or currency in the form of a coin disbursement. If the player decides to receive a coin disbursement, the gaming device 100 activates a coin hopper or coin handling device (not shown) which physically counts and delivers the proper number of coins to the player. The coin handling device is commonly configured to transport coins from a supply source (hopper or bin filled with coins) to a coin tray 124 or payout receptacle where the player physically receives the coins. The player might also elect to cash out by having a ticket or other media dispersed, such as via a printer 114.

It will be appreciated that the gaming device just described and illustrated in FIG. 1 is only exemplary of a gaming device to which the cooling method and system are applicable. For example, the above-described gaming machine is configured as an "upright" gaming machine. The principles of the invention may be applied to machines of other configurations, such as "slant-top", "bar-top" and other configurations. In addition, the gaming machine to which the cooling system and method are applicable does not need to have the particular components described above or be configured to operate in the particular manner described above. For example, the gaming device need not be configured as a wagering device or need not be configured to provide monetary or credit awards. For example, the gaming device might award points or prizes.

Figure 2:
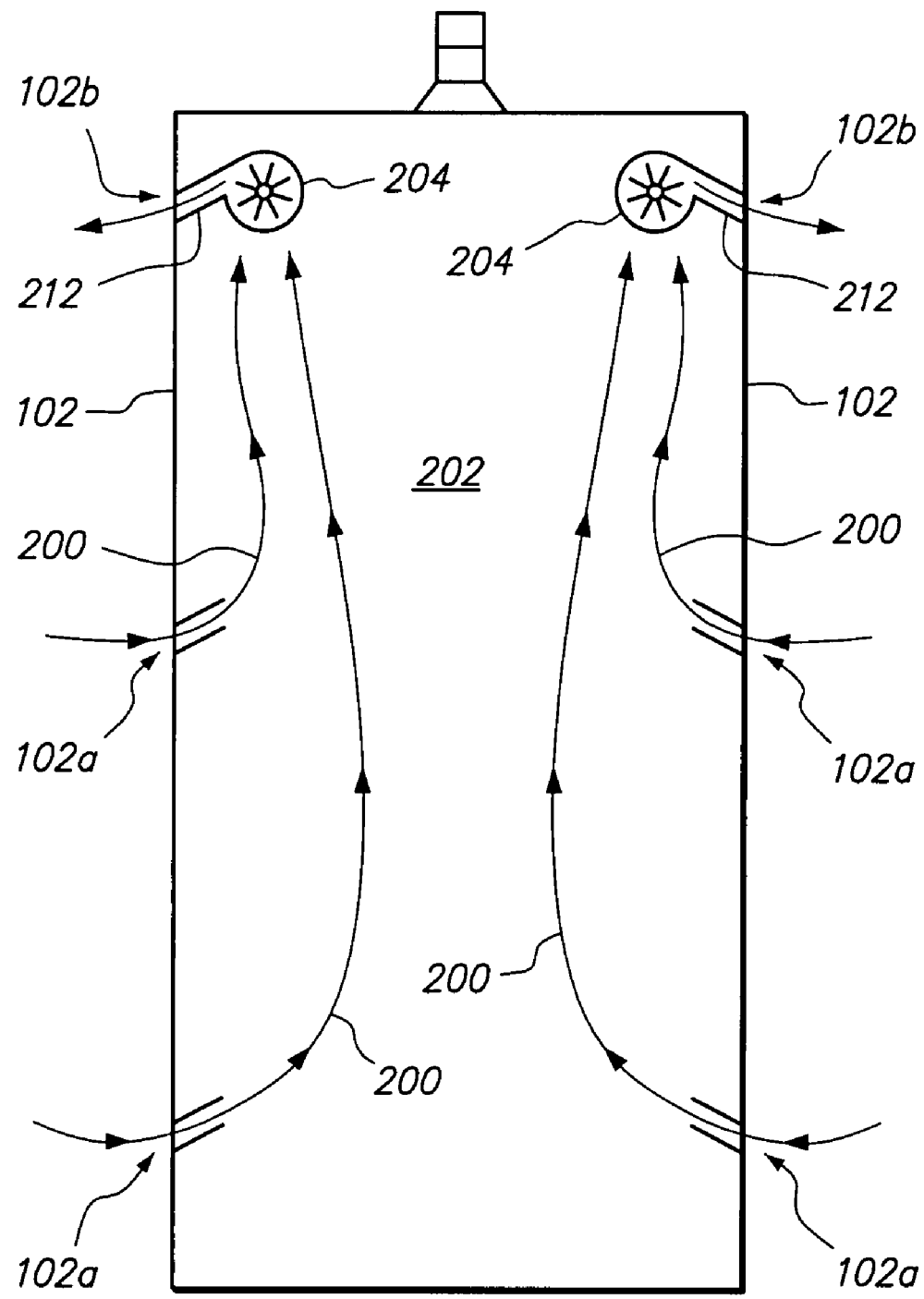
FIG. 2 is a front view of the gaming device of FIG. 1 with the front door and the primary internal components removed, illustrating one exemplary air flow path.

The present invention comprises a cooling system and method. The cooling system and method have particular applicability to a gaming device or machine. Various aspects of the cooling system and method will be described with reference to FIGS. 2 and 3. FIG. 2 illustrates an interior portion of a gaming machine such as that illustrated in FIG. 1, without the various components thereof.

FIG. 2 illustrates various components of a cooling system of the invention, as well air flow paths or currents 200 in accordance with a method of use of the system. In one embodiment, the cooling system comprises one or more vents, ports or openings. Preferably, each vent defines a pathway through the housing or other portion of the gaming device 100 from an exterior to an interior 202 thereof, through which air may pass. FIG. 2 illustrates a configuration in which the interior 202 of the gaming device 100 comprises one generally open area. It will be appreciated that the gaming device 100 might have more than one interior space, however, in which case the cooling system of the invention might be applied to each space.

The vents may be configured to permit flow of air in only one direction (such as by including a valve), or may permit air to flow in either direction. In a preferred embodiment, the vents may permit air to flow in either direction there through. However, the vents have been identified as "inlet/intake" or "outlet/exhaust" vents based upon the direction air normally or predominantly passes in accordance with the system and method. In particular, a vent is identified as an "inlet" or "intake" vent when the predominant flow of air is from an exterior of the gaming device to the interior thereof, and as an "outlet" or "exhaust" vent when the predominant flow of air is from the interior to the exterior thereof.

In one configuration, as shown in FIG. 2, the cooling system includes four inlet vents 102a and two exhaust vents 102b. In a preferred embodiment, the inlet vents 102a are located below the exhaust vents 102a, and preferably in a location where air may flow into a bottom or lower portion of the interior 202 of the housing 102. Preferably, the exhaust vents 102b are located above the inlet vents 102a, and preferably in a location where air may be exhausted from a top portion of the interior 202 of the housing 102.

In one embodiment, the inlet vents 102a and exhaust vents 102b are located on each side of the housing 102. The number of inlet vents and exhaust vents may vary, as may their location, size and shape.

The cooling system includes a means for moving air such as an air flow device or air handler/mover. Preferably, the means for moving air is configured to move air at high volumetric rates and/or at positive pressure. In one embodiment, the means for moving air comprises at least one blower, and preferably a centrifugal or turbine type blower 204. Such blowers may have variety of configurations. In one embodiment, such a blower may comprise an impeller located in a housing, the impeller configured to draw air into the housing and expel that air back out of the housing, as described in more detail below.

One exemplary blower that is suitable for use with the present invention is produced by Pelonis Technologies Inc. of Malvern, Pa. The blower may be one selected from the Pelonis' RD9733 Series. The RD9733 series provides blowers having either ball or sleeve type bearing assemblies, air flow rates from about 14 to 22 cubic feet per minute (CFM), and a pressure differential from about 0.3 to 0.8 inches of water (in wg or in H20). This series of blowers further comprises a frame and impeller fabricated from reinforced plastic PBT, Class UL94V-0. The operating temperatures for these blowers are in the range of −10 to +70 degrees Celsius at 35-85% relative humidity. The blower uses a brushless DC motor with a permanent magnet to drive the impeller. Additionally, the blower may be configured with various options such as an auto-start feature which protects the bower if obstructed by a foreign object; a thermal speed control that adjusts fan speed according to temperature; a tachometer which informs the user of the blower running speed and/or an alarm which informs the user in the event of a fan failure.

In one embodiment of the invention, the cooling system is configured so that each blower 204 communicates with at least one, and preferably only one, exhaust vent 102b. Each blower 204 draws air from within the interior 202 of the gaming device and expels it through the exhaust vent 102b to the exterior of the gaming device. In this configuration, cooling air is drawn into the inlet vents 102a as a result of the reduced air pressure inside of the gaming device. As the cooling air flows through the interior 202 of the gaming device, as depicted by flow patterns 200, heat transfer takes place between the components located therein and the cooling air.

The cooler fresh air that is drawn into the gaming device 100 extracts heat from the components by way of convection. Convection is the transfer of heat from a component at a high temperature to a surrounding fluid at a lower temperature by circulation/movement of the fluid with respect to the component. There are two primary types of convection, and the cooling system of the present invention advantageously employs both types in order to maximize cooling efficiency. First, natural convection is such as the air surrounding the hot components absorbs heat from those components, reducing the density of the air. The reduction in density causes the lower density air to be displaced by cooler air having a higher density. This exchange of high temperature-low density air with low temperature-high density air produces a natural convection current. In accordance with the cooling system, this convection current naturally causes the cooling air to move from the intake vents 102a upwardly through the interior of the gaming machine to the exhaust vents 102b. In addition, the one or more blowers 204 create forced convection by propelling the air. The one or more blowers 204 create an artificially induced convection current which enhances and increases the rate of heat transfer because there is more fluid flowing over the high temperature components in the machine.

Figure 3:
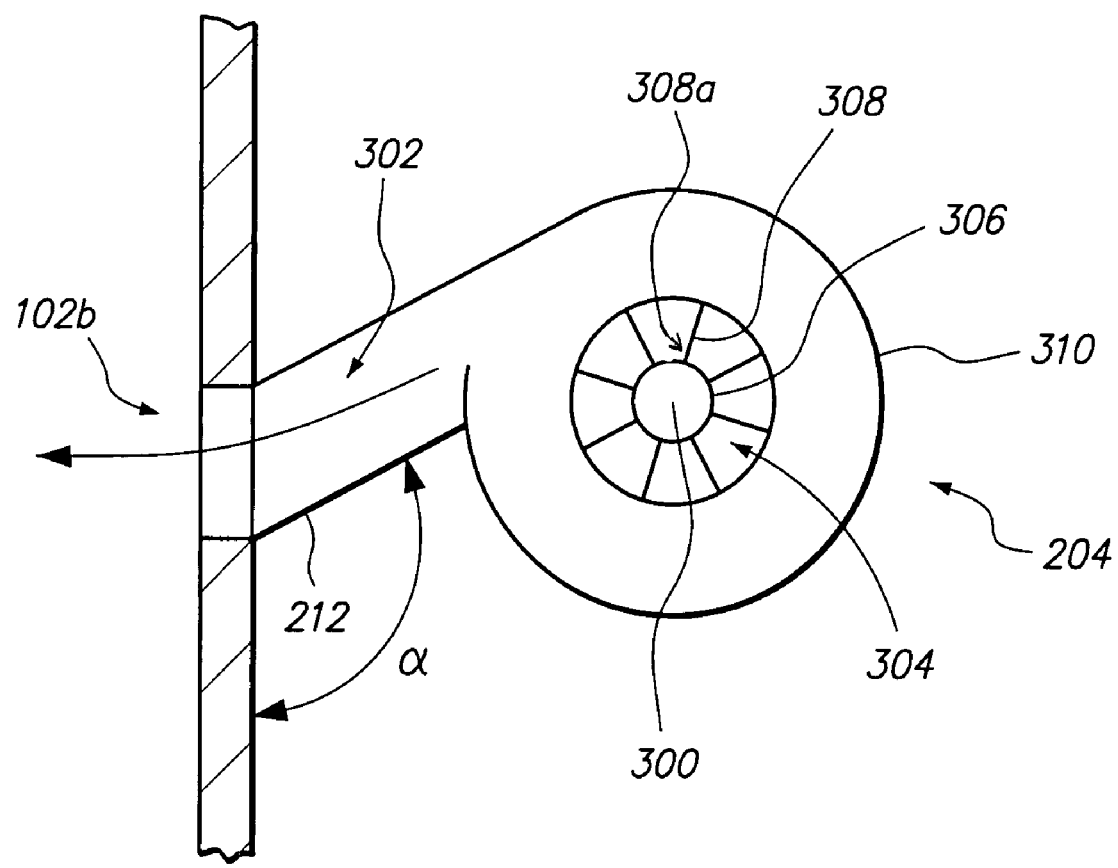
FIG. 3 which is an enlarged detail view of an air flow device coupled to an exhaust air vent.

Reference is now made to FIG. 3, which is a detail view illustrating a centrifugal blower 204 associated with an exhaust vent 102b of an exemplary embodiment of the invention. The centrifugal blower 204 has a low pressure inlet port 300 and a high pressure outlet/exhaust port 302. In a preferred embodiment, the total pressure or pressure differential created by the blower 204 may be 0.1-0.5 inches of water gauge (in wg) or more. This contrast substantially from axial fans typically used to move air relative to computing and gaming devices, which may generate a total pressure of only slightly above 0.0 in wg, such as 0.01-0.05 in wg (whereby the blower of the invention may provide a pressure differential of 3-10 times, or more, the pressure differential which may be achieved with the axial fan).

The centrifugal blower 204 has a moving vaned or bladed component, such as a squirrel cage and/or impeller 304. In one embodiment, for example, an impeller 304 may have a turbine configuration in which a turbine is mounted to a central shaft 306, the turbine having a generally flat mounting surface with a plurality of vanes extending there from, such as in a spiral configuration. In the embodiment illustrated, the impeller 304 comprises a squirrel-cage type structure in which a plurality of vanes 308 extend outwardly from the central shaft 306, the vanes 308 are aligned with one another in a generally circular path. In this configuration, air may be drawn into an opening 308a at the inside edges of the vanes 308, the vanes then expelling the air from at the outer edges thereof. One such squirrel cage configuration is illustrated and described in more detail in U.S. Pat. No. 4,738,593, which is incorporated herein by reference.

In one embodiment, the impeller 304 is contained within a blower housing 310 that defines at least one inlet or intake port and at least one exhaust or outlet port. As a result of rotation of the impeller 304, air enters the one or more inlets. The vanes of the impeller 304 then centrifugally accelerate the air to the at least one exit or outlet port 302. As illustrated, the at least one outlet of the impeller 304 is preferably in communication with one of the exhaust ports of the gaming device.

One embodiment of the invention is an air vent for a gaming device. In one embodiment, the vent is configured to reduce or prevent the entry of material, such as water, into the interior of the gaming device. In general, the vent includes an upwardly sloping section, such that gravity deters the flow of material through the vent.

Referring again to FIG. 2, in accordance with one embodiment of the cooling system, the inlet and exhaust vents 102a, 102b are configured with a duct or extension 212 that extends into the interior region 202 of the gaming device 100. In general, the vents may comprise a rectangular cutout in a side of the housing, where the vents have a lower edge, an opposing upper edge, a first side and an opposing second side. In another variation, the vents may have a circular configuration with a circumferential edge. The duct 212 extends from that opening into the gaming device. In one embodiment, at least a bottom or lowest portion of the duct 212 slopes or angles upwardly in one or more locations. For example, in FIG. 3 the lower portion of the duct 212 forms an angle a that is greater than 90 degrees. The upwardly sloping vent/duct configuration retards or prevents materials such as water or other contaminants from entering the interior of the gaming device 100. In particular, this vent/duct configuration requires the contaminants to move or flow upwardly against the force of gravity (and in the case of the exhaust vents, the force of the exhausted air flowing through the vent/duct) to enter the gaming device. It is further contemplated that a particle filter may be associated with at least the inlet vents 102a to further reduce the introduction of solid contaminants, such as dust and dirt, from entering the housing 102.

It will be appreciated that the upwardly extending vent configuration may be accomplished in a variety of manners. As indicated above, it may be accomplished with a duct or flange. However, it might be formed via a conduit that leads from the opening in the housing. Such a conduit could be connected to the housing or actually comprise a portion of the wall of the housing. In one embodiment, the duct or conduit might extend inwardly and then rise upwardly or have other configurations whereby one or more areas prevent the flow of material through the vent/duct.

As indicated above, the centrifugal blower 204 is coupled with an exhaust vent 102b. As shown in FIG. 3, the blower outlet 302 extends to the duct 212 of the exhaust vent 102b. One important aspect of the preferred embodiment is that the flange/blower be configured such that entry of contaminants is prevented. This may be accomplished by mounting the centrifugal blower 204 such that any contaminants are deflected downward and out of the exhaust vent 102b. For example, the blower housing may be mounted to the duct 212 to produce an "alpha" angle that is greater than 90 degrees. As a result, if a contaminant such as water was directed into the exhaust vent 102b, the fluid is deflected and directed to flow outwardly from the gaming device 100.

The centrifugal blower 204 may be coupled or mounted to the exhaust vent 102b in other ways. For example, the blower 204 may be integrally formed with an extension or duct and be mounted directly into alignment with the vent in an orientation such that the upwardly sloping configuration is achieved.

The blower outlet port 302 maybe aligned with the duct 212 and/or exhaust vent 102b and structurally held in place by a bracket. The bracket may be mounted between the blower 204 and an interior portion of the gaming device housing 102. It is contemplated that many various mounting configurations are possible that produce a downwardly sloping alignment between the blower outlet port 302 and the exhaust vent 102b and one of ordinary skill the art would inherently develop these variations within the spirit and scope of the presently disclosed invention. The blower 204 might also be connected to the vent via a conduit or other element(s) forming a close flow path.

In the embodiment illustrated, the gaming device is provided with two exhaust vents 102b and a blower 204 associated with each exhaust vent. In other embodiments, there might be more than two exhaust vents and or as few as one exhaust vent. Further, there may be a single blower associated with one or more exhaust vents. For example, the cooling system may use one or more inlet vents 102a and only one larger exhaust vent 102b having a single large centrifugal blower coupled thereto. The use of a larger centrifugal blower may provide a substantial increase in the volumetric air flow rate. It is contemplated that the sides of the gaming device housing 102 be configured with a plurality of smaller inlet vents 102a and the back of the housing configured with one large exhaust vent 102b.

As indicated, the gaming device includes four intake vents 102a. The number of vents may vary. Preferably, the number and size of the intake vent or vents are selected to at least allow a volume flow of air to flow into the gaming device as the one or more blowers of the cooling system can exhaust there from at maximum rate.

The vents may have other configurations. As illustrated, each vent is an opening in the housing. The opening could be located outwardly of the housing, such as at the end of a conduit or duct extending through the housing.

In another embodiment, the blower may be housed inside of an air intake plenum or chamber. The air intake plenum or chamber is generally a secondary enclosure located within the interior region of the gaming device. The plenum/chamber has an opening on one side which encloses at least one blower and couples the blower's exhaust port with at least one dedicated exhaust opening of the plenum/chamber. The air intake plenum/chamber has a primary intake opening that is coupled with a fresh air inlet vent of the gaming device. As a result of the blower(s) being enclosed within the plenum/chamber, fresh air is drawn into the plenum/chamber through the fresh air inlet vent and subsequently into the inlet of the blower(s). The air is then accelerated by the impeller of the blower(s) and exhausted through the blowers' exhaust port through the plenum/chamber exhaust opening and into the interior region of the gaming device. The air intake plenum/chamber may be configured to prevent direct physical access into the interior region of the gaming device. In this way, the plenum/chamber provides additional security for the gaming device by preventing a player or person from inserting an object into the interior portion of the gaming device by way of the air intake/exhaust vent. Of course, more than one blower may be associated with a single air chamber. In addition, in such a configuration, the air chamber may be configured so that the one or more blowers draw air from within the gaming device and exhaust it through at least one exhaust opening of the chamber to a gaming machine housing exhaust vent.

As indicated, in the preferred embodiment, the one or more blowers (or other air moving devices) are located at the top of the gaming machine and expel air from the interior to the exterior of the gaming machine. As detailed herein, this configuration has a number of particular advantages. In some cases, a gaming machine may not permit location of the one or more blowers at or near the top of the machine. For example, in a bar top type gaming machine, various components of the machine may extend downwardly from the top thereof, thus interfering with the location of blowers except at the bottom of the machine. In such instances, the one or more blowers may be configured to draw air into the machine and the bottom and cause the cooling air to be forced through the machine to one or more air exhaust vents, such as near the top of the machine. An advantage of the configuration of the invention is that the one or more blowers create sufficient positive pressure to overcome the internal "impedance" of the machine (the interior pressure and air flow resistance) so as to create a very high air flow rate through the machine.

The cooling system of the invention has numerous advantages. First, one aspect of the invention is a gaming machine having a cooling system with vents which include at least one upwardly extending inlet or outlet section. In this manner, the vent or vents are configured to reduce the entry of contaminants into the gaming device. For example, in the event water was to flow downwardly along the sides of the gaming device, that water would be prevented from flowing into the interior of the machine through the vents.

Another aspect of the invention is a cooling system which takes advantage of both natural convention and positive air handlers/movers, such as by location of the intake and exhaust vents and the associated air movers.

Additionally, another advantage of one or more embodiments of the invention is a cooling system configuration wherein the coupling of an air flow device with an exhaust vent provides a high volume cooling system that is less noticeable to the player. By combining the blower with the exhaust vent, a negative pressure is developed within the gaming device's interior area. As a result, air is drawn into the gaming device through the inlet vents. The air is then expelled primarily through the exhaust vents. Correspondingly, any other openings in the gaming device housing will have surrounding air drawn into the interior area due to the negative (low) pressure. For example, a small seam surrounding a button or display device would function like a small inlet vent and the player would unlikely notice air being drawn into the gaming device at these seems. Conversely, if the blower was associated with the inlet vent (i.e., the inlet port of the blower attached to the inlet vent) a positive (high) pressure would be developed within the interior area. In this case, the player would more likely notice the movement of air through the gaming device because any seems would be blowing air outwards of the gaming device and noticeably onto the player. Thus, a player would likely feel the positive pressure escaping from the gaming device through any component that was not adequately sealed.

Yet another aspect of the invention is a cooling system which utilizes air movers which create a positive exhaust pressure. These air movers can be utilized to create a low air pressure condition inside of the gaming device, resulting in a high cooling air flow into the gaming device. In addition, these air movers exhaust air at sufficiently high pressure to overcome the air pressure outside of the device, ensuring high volumetric flow rates of air can be achieved.

It will be understood that the above described arrangements of apparatus and the method there from are merely illustrative of applications of the principles of this invention and many other embodiments and modifications may be made without departing from the spirit and scope of the invention as defined in the claims.

What is claimed is:

1. A gaming device cooling system comprising:
   a gaming device having a housing defining an interior area, said housing having at least one inlet vent and at least one exhaust vent there through which permit air to flow to and from said interior area to an exterior of said housing;
   said at least one inlet vent having a duct extending into said interior area of said housing, said duct having at least one portion which slopes upwardly from said inlet vent, whereby said duct is configured to prevent the flow of water into said interior area; and
   said at least one exhaust vent having a duct extending into said interior area of said housing, said duct having at least one portion which slopes upwardly from said exhaust vent, whereby said duct is configured to prevent the flow of water into said interior area.

2. The gaming device cooling system in accordance with claim 1, wherein said housing has at least one inlet vent located at a first side of said housing and at least one inlet vent located at a second side of said housing.

3. The gaming device cooling system in accordance with claim 1, wherein said at least one exhaust vent is located at a back of said housing.

4. The gaming device cooling system in accordance with claim 1, wherein said at least one exhaust vent has a substantially larger area than said at least one inlet vent.

5. The gaming device cooling system in accordance with claim 1, wherein said at least one inlet vent and said least one exhaust vent are generally rectangular in shape.

6. The gaming device cooling system in accordance with claim 1, wherein said at least one inlet vent and said at least one exhaust vent are generally circular in shape.

7. The gaming device cooling system in accordance with claim 1, wherein a particle filter is located at said at least one inlet vent.

8. A gaming device cooling system comprising:
a gaming device having a housing defining an interior area, said housing having at least one inlet vent and at least one exhaust vent there through which permit air to flow to and from said interior area to an exterior of said housing;
said at least one inlet vent having a duct extending into said interior area of said housing, said duct having at least one portion which slopes upwardly from said inlet vent, whereby said duct is configured to prevent the flow of water into said interior area; and
said at least one exhaust vent having a duct extending into said interior area of said housing.

9. The gaming device cooling system in accordance with claim 8 further including at least one air moving device configured to move air through said interior area from said at least one inlet vent to said at least one exhaust vent.

10. The gaming device cooling system in accordance with claim 8 wherein said at least one air moving device is located in said interior area of said housing.

11. The gaming device cooling system in accordance with claim 8 wherein said at least one air moving device has an outlet port in communication with said duct of one of said at least one exhaust vents.

12. A gaming device cooling system comprising:
a gaming device having a housing defining an interior area, said housing having at least one inlet vent and at least one exhaust vent there through which permit air to flow to and from said interior area to an exterior of said housing;
said at least one inlet vent having a duct extending into said interior area of said housing; and
said at least one exhaust vent having a duct extending into said interior area of said housing, said duct having at least one portion which slopes upwardly from said exhaust vent, whereby said duct is configured to prevent the flow of water into said interior area.

13. The gaming device cooling system in accordance with claim 12 further including at least one air moving device configured to move air through said interior area from said at least one inlet vent to said at least one exhaust vent.

14. The gaming device cooling system in accordance with claim 12 wherein said at least one air moving device is located in said interior area of said housing.

15. The gaming device cooling system in accordance with claim 12 wherein said at least one air moving device has an outlet port in communication with said duct of one of said at least one exhaust vents.

* * * * *